(12) United States Patent
Schaffer et al.

(10) Patent No.: US 7,301,235 B2
(45) Date of Patent: Nov. 27, 2007

(54) SEMICONDUCTOR DEVICE MODULE WITH FLIP CHIP DEVICES ON A COMMON LEAD FRAME

(75) Inventors: Christopher P. Schaffer, Fallbrook, CA (US); Chuan Cheah, Redondo Beach, CA (US); Kevin Hu, Santa Monica, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/144,169

(22) Filed: Jun. 3, 2005

(65) Prior Publication Data

US 2005/0280163 A1    Dec. 22, 2005

Related U.S. Application Data

(60) Provisional application No. 60/576,703, filed on Jun. 3, 2004.

(51) Int. Cl.
*H01L 23/34* (2006.01)
(52) U.S. Cl. ................................... 257/724
(58) Field of Classification Search ........ 257/734–738, 257/666, 724–728, 678–692, E23.141
See application file for complete search history.

(56) References Cited

U.S. PATENT DOCUMENTS

| 5,751,009 | A | 5/1998 | Anderson et al. |
| 5,770,480 | A | 6/1998 | Ma et al. |
| 5,977,630 | A | 11/1999 | Woodworth et al. |
| 6,144,093 | A | 11/2000 | Davis et al. |
| 6,388,319 | B1 | 5/2002 | Cheah |
| 6,396,138 | B1 | 5/2002 | Cheah |
| 6,404,050 | B2 | 6/2002 | Davis et al. |
| 6,448,643 | B2 | 9/2002 | Cheah et al. |
| 6,465,875 | B2 | 10/2002 | Connah et al. |
| 6,489,678 | B1 | 12/2002 | Joshi |
| 6,586,280 | B2 | 7/2003 | Cheah |
| 6,593,622 | B2 | 7/2003 | Kinzer et al. |
| 6,627,991 | B1 | 9/2003 | Joshi |
| 6,649,832 | B1 | 11/2003 | Brophy et al. |
| 6,696,321 | B2 | 2/2004 | Joshi |
| 6,798,044 | B2 | 9/2004 | Joshi |
| 6,858,922 | B2 | 2/2005 | Pavier |
| 6,919,643 | B2 * | 7/2005 | Wheeler et al. ............ 257/778 |
| 7,045,884 | B2 * | 5/2006 | Standing ..................... 257/678 |

(Continued)

OTHER PUBLICATIONS

PCT International Search Report for International Application No. PCT/US05/19511mailed Oct. 31, 2006.

(Continued)

*Primary Examiner*—Nathan W. Ha
(74) *Attorney, Agent, or Firm*—Ostrolenk, Faber, Gerb & Soffen, LLP

(57) ABSTRACT

The semiconductor portion of a circuit includes a plurality of flip chip devices which are arranged in a planar fashion in a common housing. The plurality of flip chip devices are connected to each other without wire bonding. The common housing includes a packaging structure, the packaging structure including a connective portion and at least one web portion, which aids in the thermal management of the heat emitted by the plurality of flip chip devices and which connects the flip chip devices to each other. Passive devices in the circuit may also be arranged in a planar fashion in the common housing.

17 Claims, 3 Drawing Sheets

U.S. PATENT DOCUMENTS

| | | |
|---|---|---|
| 2002/0070441 A1 | 6/2002 | Cheah |
| 2002/0190285 A1 | 12/2002 | Sakamoto et al. |
| 2003/0107126 A1 | 6/2003 | Joshi |
| 2003/0122247 A1 | 7/2003 | Joshi |
| 2004/0061221 A1 | 4/2004 | Schaffer |
| 2004/0140559 A1 | 7/2004 | Goller et al. |
| 2004/0159939 A1 | 8/2004 | Joshi |
| 2005/0029668 A1* | 2/2005 | Poo et al. .................... 257/773 |
| 2005/0121784 A1* | 6/2005 | Standing ..................... 257/737 |
| 2005/0218494 A1* | 10/2005 | Satou et al. ................ 257/678 |
| 2005/0218498 A1* | 10/2005 | Hata et al. .................. 257/690 |
| 2006/0138532 A1* | 6/2006 | Okamoto et al. ........... 257/328 |

OTHER PUBLICATIONS

*Flip Chip Power MOSFET: A New Wafer Scale Packaging Technique*, by Aram Arzumanyan et al., as presented at ISPSD, Jun. 2001.

*DirectFET™—A Proprietary New Source Mounted Power Package for Board Mounted Power*, by Andrew Sawle et al.

* cited by examiner

SEMICONDUCTOR DEVICE MODULE WITH FLIP CHIP DEVICES ON A COMMON LEAD FRAME

CROSS-REFERENCE TO RELATED APPLICATION

This application claims the benefit of U.S. Provisional Application No. 60/576,703, filed on Jun. 3, 2004, the entirety of the contents of which is hereby incorporated by reference herein.

BACKGROUND OF THE INVENTION

1. Field of the Invention

The present invention relates to a module comprising flip chip devices forming at least the semiconductor portion of a circuit.

2. Description of the Related Art

Numerous types of electrical circuits, such as DC to DC converters, synchronous converters, and the like, require a number of semiconductor components such as MOSFETs and ICs. Such circuit components can be found in portable electronics apparatus and the support components are commonly separately housed and mounted individually on a support board. The separately housed parts take up board space and each part generates heat. If the part is near other components, such as microprocessors, the part can interfere with the operation of the microprocessor.

To address the twin problems of heat generation and the occupation of board space, at least two different approaches have been applied previously.

One approach has been to arrange various semiconductor components in a planar fashion in a single housing. An exemplary circuit diagram, including semiconductor components, which are arranged in a planar fashion on a single substrate, is shown in FIG. 1, which was originally shown as FIG. 2 of U.S. Pat. No. 6,388,319.

FIG. 1 shows a synchronous buck converter circuit having an N-channel MOSFET 4 as a switching device, and an N-channel synchronous MOSFET 5 and a Schottky diode 6 in parallel for synchronous rectification. The N-channel MOSFET 4, N-channel MOSFET 5, and Schottky diode 6 are arranged in a planar fashion within a common housing 7. However, the control circuit 8 connected to the gates of MOSFETs 4 and 5 is not contained within the previously mentioned common housing 7. Since the source (top) of die 4 is connected to the drain (bottom) of die 5, it was required to insulate die 5 from the substrate, and wire bond. In addition, control chip 8 was separate because it had to be insulated from the board.

Other patents taking the approach of arranging semiconductor components in a planar fashion within a common housing include U.S. Pat. Nos. 5,977,630, 6,144,093, 6,404,050, 6,448,643, 6,465,875, 6,593,622, and 6,696,321. Significantly, however, in all of the references previously cited, wire bonding was used extensively to make the necessary connections between the semiconductor components. Such wire bonding leads to higher resistance and inductance. Additionally, although packaging the components in a common housing reduces the thermal effects of the components when compared to the components being housed separately, further improvement in thermal management is desirable.

A second approach toward confronting the problems of occupation of board space and thermal management involves the use of stacked or superimposed die contained within a common housing. Such an approach is exemplified by U.S. Pat. Nos. 5,770,480, 6,798,044 and 6,858,922. Such an approach should conserve board space even more than the planar arrangement approach. In addition, wire bonding between the die can be eliminated. However, such an approach may involve increases in the thermal effects the operation of one die would have on the other die stacked or superimposed on it over the planar arrangement approach.

SUMMARY OF THE INVENTION

In light of the above problems and considerations discovered through an examination of the related art, the present invention has several objects.

First, the present invention seeks to provide a planar arrangement of semiconductor components in a common housing so as to conserve circuit board space.

Second, it is an object of the present invention to provide such a planar arrangement, while eliminating the need to provide wire bonding to effect connections between the various die in the common housing.

Third, it is an object of the present invention to provide a planar arrangement of die in a common housing that exhibits superior thermal management over conventional planar arrangements of die and over stacked or superimposed arrangements of die.

Therefore, the invention comprises a plurality of flip chip devices arranged on a common lead frame or other circuit substrate, the arrangement being in substantially planar fashion without any stacking or superimposing of one flip chip device over any other flip chip device. The connections between the flip chip devices are made without any wire bonding. The connection between at least some of the flip chip devices provides improved thermal management over that available with conventional planar arrangements of die or stacked or superimposed arrangements of die in a common housing.

Thus, for a buck converter circuit, the control FET can be a top drain MOSFET, of the type disclosed in U.S. Provisional Application No. 60/539,549, filed Jan. 26, 2004, with its drain and gate on the top of the die, the drain and gate contacting the lead frame and the source on top when the die is flipped. The synchronous FET can be a Direct FET™ type, which was disclosed in U.S. Pat. No. 6,624,522, having its drain on the die top, and its source and gate on the die bottom, so that it can be connected to the source of the top drain FET through a T-PAC type packaging structure, which was disclosed in U.S. Patent Publication No. 2004/0061221 A1, the entirety of the contents of which are hereby incorporated by reference herein. Other conventional vertical conduction device packages can also be used to connect the synchronous FET and the top drain FET. The IC is also a flip chip so its bottom can be connected by traces patterned in the lead frame to the gates of the control FET and the synchronous FET. Thus, the need for wire bonding is avoided.

Other features and advantages of the present invention will become apparent from the following description of the invention which refers to the accompanying drawings.

BRIEF DESCRIPTION OF THE DRAWINGS

FIG. 5 also schematically shows the flow of the current therein, corresponding to the circuit shown in FIG. 2.

DETAILED DESCRIPTION OF THE INVENTION

Figure 1:
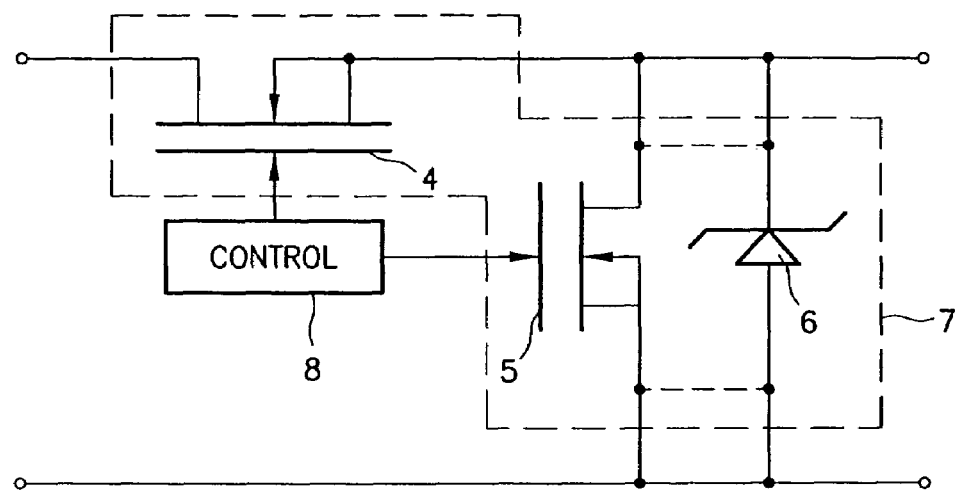
FIG. 1 is a circuit diagram showing a conventional arrangement of a semiconductor portion of a circuit in a common housing.
Figure 2:
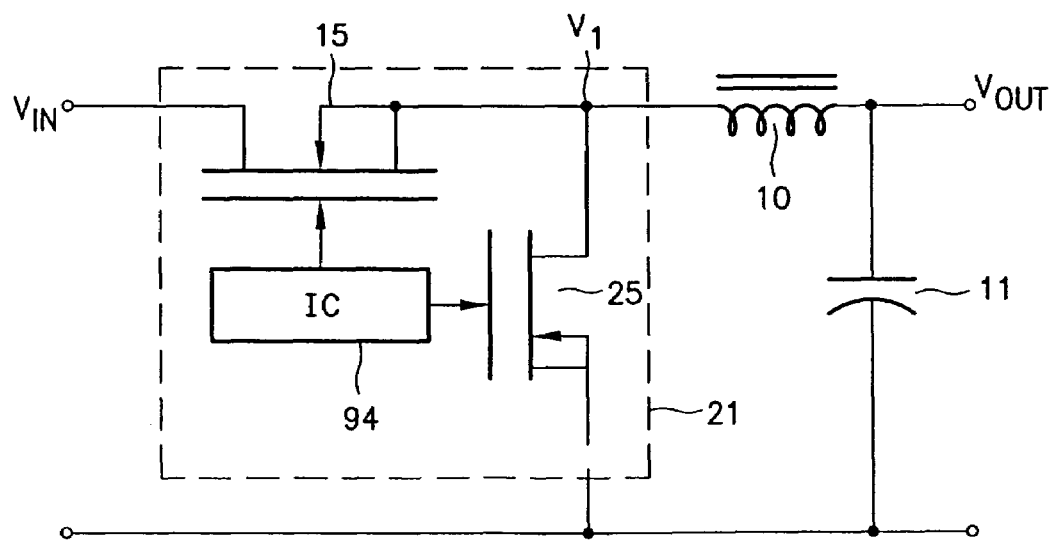
FIG. 2 is a circuit diagram of the invention, showing a semiconductor portion of a circuit arranged in a common housing.

FIG. 2 shows a circuit diagram of a buck converter circuit including a MOSFET of top drain construction 15, a synchronous MOSFET 25, the synchronous MOSFET 25 being of a DirectFET™ type, a flip chip type IC 94, controlling MOSFETs 15 and 25 in a PWM mode to obtain a constant output DC voltage, an inductor 10 and a capacitor 11. The buck converter circuit, sometimes known as a step down converter, is commonly used to reduce voltages. Therefore, the input voltage $V_{IN}$ is greater than the output voltage $V_{OUT}$. The MOSFET die 15, the MOSFET die 25, and the IC die 94 are arranged in a common housing 21. The die 15, 25, 94 are arranged in a planar fashion on a lead frame 20 or other substrate which is both thermally and electrically conductive.

The thermal conductivity of the lead frame or other substrate is needed to assure effective transmission of heat away from die 15, 25, 94 and toward one or more heatsinks (not shown) below the lead frame or other substrate. The electrical conductivity of the lead frame or the substrate is needed to permit electrical connections between the IC 94 and the MOSFETs 15, 25, as will be described in more detail, and to allow transmission of the input voltage $V_{IN}$ and an output voltage $V_1$, (see FIG. 2), to and from the common housing 21, respectively. Substrates other than lead frames which are thermally and electrically conductive include direct-bond copper (DBC), printed circuit boards (PCB), printed wiring boards (PWB), and flexible circuits.

Figure 3:
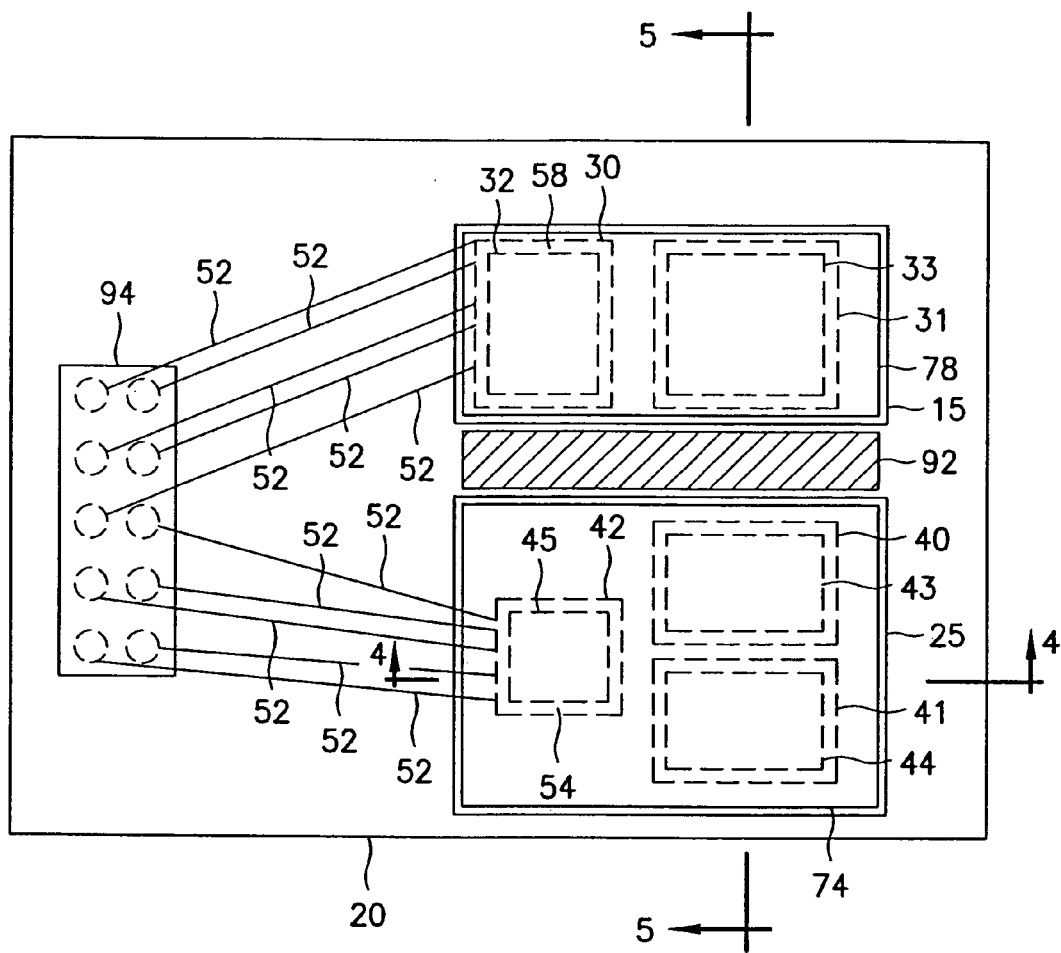
FIG. 3 is a plan view of an embodiment of the invention corresponding to the components of the circuit shown in FIG. 2 as being included in a common housing.

Referring to FIG. 3, IC 94 is directly bonded to the lead frame 20 or other substrate by solder or conductive epoxy (not shown). (As used herein, the term "flip chip" denotes a chip which is attached with a surface down directly to the lead frame or other substrate without any wire bonding, the flip chip having appropriately prepared bond pads.) Lead frame 20 has contact areas 30 and 31 which receive a gate electrode 32 and a drain electrode 33, respectively, of the MOSFET 15. The lead frame 20 also has source contacts 40 and 41 to contact source electrodes 43 and 44, respectively, of MOSFET 25. In addition, the lead frame 20 has a gate contact area 42 to receive the gate electrode 45 of MOSFET 25. The lead frame 20 or other substrate also has traces 52, shown schematically, patterned in the lead frame or other substrate, connecting the IC 94 to gate contact areas 30, 42.

Gate contact areas 30, 42 are in turn connected to gate electrodes 32, 45, respectively, through solder or conductive epoxy 58 and through solder or conductive epoxy 54, respectively. Likewise, referring to FIG. 5, source contact areas 40 and 41 are connected to source electrodes 43 and 44, respectively, through solder or conductive epoxy 62 and solder or conductive epoxy 60, respectively. The drain contact area 31 is connected to the drain electrode 33 through solder or conductive epoxy 66.

MOSFET 25 is of DirectFET™ construction manufactured by International Rectifier Corporation. Thus, referring to FIG. 5, MOSFET 25 is passivated on the surface 70 of the die, on which the source and gate electrodes 43, 44, 45 are located, in order to prevent shorting between source and gate electrodes and to protect them from moisture and other contamination. The drain contact 74 of MOSFET 25 is connected to the source electrode 78 of MOSFET 15 through the conductive T-PAC type packaging structure 50, which also provides a pathway to conduct the output voltage $V_1$, shown in FIG. 2, to lead frame 20 or other substrate, as shown schematically in FIG. 5.

Figure 4:
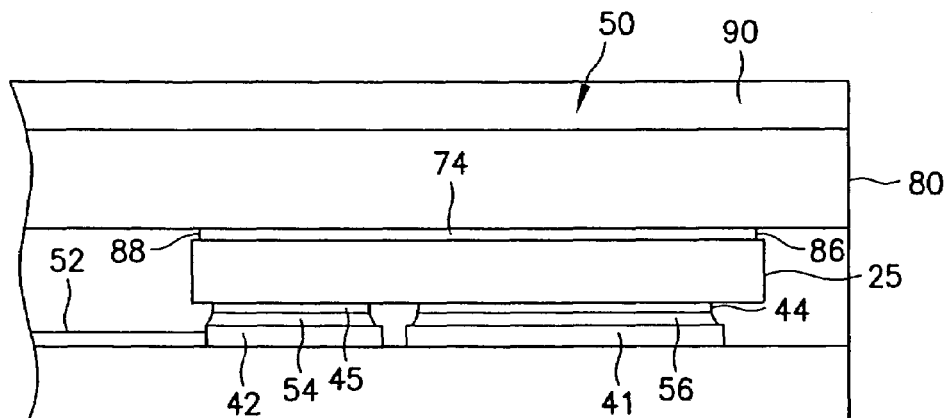
FIG. 4 is a cross-sectional view of FIG. 3 taken through section lines 4-4 in FIG. 3.

In addition, the use of the T-PAC type packaging 50 provides improved thermal management. The T-PAC type packaging structure 50 is comprised of a connective portion 80 and a web portion 82. The web portion 82 is connected to the lead frame 20 or other substrate by solder or conductive epoxy 84. The connective portion 80 is connected to drain contact 74 of MOSFET 25 by conductive epoxy or solder 86, 88 (see FIG. 4), and is also connected to source contact 78 by solder or conductive epoxy (not shown). The connective portion 80 and the web portion 82 are integrally formed into a unitary body.

Figure 5:
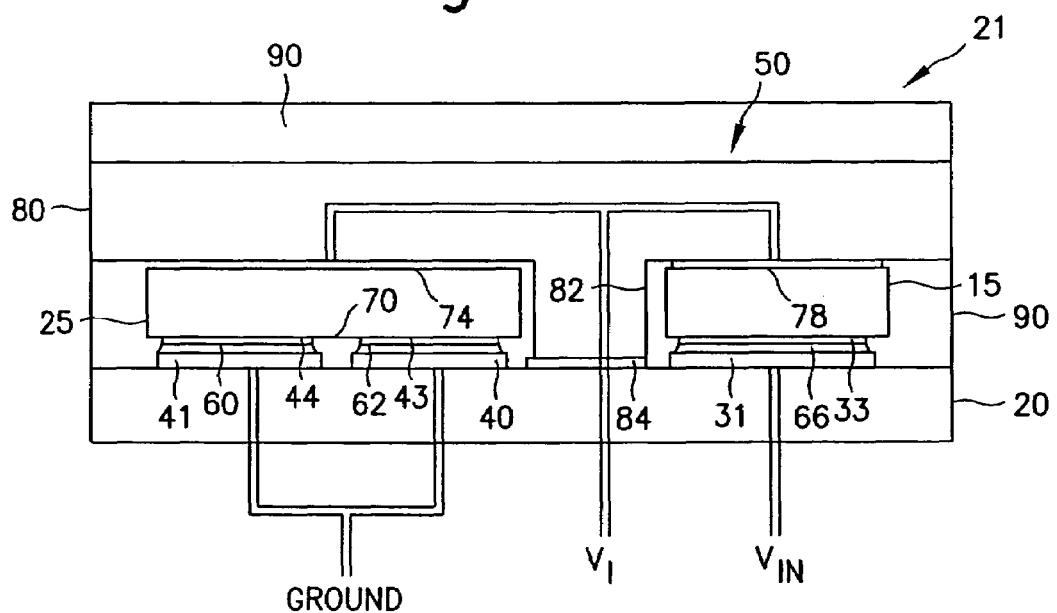
FIG. 5 is a cross-sectional view of FIG. 3 taken through section lines 5-5 in FIG. 3.

In order to implement the circuit of FIG. 2, both source contacts 40 and 41 are grounded, as shown schematically in FIG. 5, and $V_{IN}$ is supplied, through the lead frame 20 or other substrate, to drain electrode 33, as also shown schematically in FIG. 5. A conventional molded housing 90 of resin or other conventionally nonconductive material encapsulates the T-PAC packaging structure 50 and all the other components of the circuit package above the lead frame 20 or other substrate.

Figure 6:
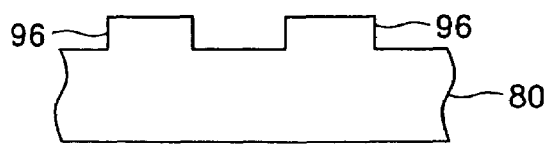
FIG. 6 is a partial elevation view of a T-PAC packaging structure showing ridges in the top surface thereof.

It should be noted that the connective portion 80 of the T-PAC packaging structure covers the entire area of the lead frame 20 or other substrate, while the web portion 82 is of sufficient dimension to only make contact with a portion of the upper surface of lead frame 20 or other substrate, the contact portion being shown as a hatched area 92 in FIG. 3. (The plan view of FIG. 3 is taken with the T-PAC type packaging structure 50 removed in order to simplify the view.) It should be understood, furthermore, that the lower surface of the connector portion 80 is above the upper surface of flip chip IC 94, and that the nonconductive material 90 composed of resin or other non-conductive material electrically isolates the flip chip IC 94 from the T-PAC packaging structure 50. The extension of the connector portion 80 of the T-PAC packaging structure 50 over the entire area of the lead frame 20 or other substrate may provide improved thermal management of the heat generated by the die over other conventional planar, stacked, or superimposed arrangements of die in common housings. Additional improvements in thermal management may be obtained by including ridges 96 in the top surface of connector portion 80 of the T-PAC packaging structure 50, as disclosed in FIG. 8A of U.S. Publication No. 2004/0061221 A1, and also shown in FIG. 6 herein. Such ridges may not only help dissipate more heat, they may also help connector portion 80 adhere better to nonconductive material 90.

Although only the MOSFET die 15, the MOSFET die 25, and the IC die 94 have been described previously as being arranged in a planar fashion on lead frame 20 or other substrate, it can easily be conceived that the inductor 10 of the buck converter circuit of FIG. 2 can also be located on lead frame 20 or other substrate. In such a case, the inductor 10 can be connected to drain contact 74 of MOSFET 25, by traces patterned in the lead frame 20 or another substrate and by the T-PAC type packaging structure 50 or other packaging structure, thus implementing yet another portion of the circuit shown in FIG. 2, without the need for wire bonding. Finally, the capacitor 11 could also be placed on the lead frame 20, and appropriate traces patterned in the lead frame 20 to connect the capacitor 11 to the inductor 10 and to the source contacts 40 and 41, thus contacting the source electrodes 43 and 44, respectively, of MOSFET 25, again without wire bonding. The addition of inductor 10 and capacitor 11 to lead frame 20 would complete the implementation of the entire buck converter circuit shown in FIG. 2 on a single lead frame or other substrate.

Although the foregoing disclosure has focused on the planar packaging of the semiconductor portion of a conventional buck converter circuit in a common housing, it should be appreciated that the invention is not limited to this particular arrangement. On the contrary, the invention can generally be applied to arrange flip chip devices, which are the semiconductor portions of various circuits, in a planar fashion in a common housing without the necessity of wire bonding. In addition, the use of a T-PAC packaging structure for the package may allow for improved heat management of the package.

It should be understood, of course, that insulating barriers or layers will be present, as needed, in the lead frame 20 or other substrate to prevent shorting between and among contacts of any semiconductor components of the circuit, any T-PAC or other packaging structure, and any passive devices on the lead frame 20 or other substrate.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. At least a semiconductor portion of a circuit, arranged in a common housing, the semiconductor portion of the circuit comprising: a plurality of flip chip power semiconductor switches operatively connected to one another wirebondlessly through a connective portion of a connector, and wirebondlessly connected to respective conductive pads of a support body, each power semiconductor die including a respective control electrode;
    a control IC for controlling the power semiconductor switches flip-chip mounted onto said support body and operatively connected to said control electrodes; and
    a web portion coupled to said connective portion, and another conductive pad on said support body, whereby said power semiconductor switches are wirebondlessly interconnected and connected to said another conductive pad.

2. At least the semiconductor portion of the circuit, arranged in the common housing of claim 1, wherein said support body is a lead frame or other thermally and electrically conductive substrate on which the plurality of flip chip die are mounted.

3. At least the semiconductor portion of the circuit, arranged in the common housing of claim 1, further comprising a common housing comprised of a resin or other nonconductive material encapsulating the packaging structure.

4. At least the semiconductor portion of the circuit, arranged in the common housing of claim 1, wherein said power semiconductor switches are MOSFETs.

5. At least the semiconductor portion of the circuit, arranged in the common housing of claim 1, wherein the circuit is a buck converter circuit.

6. At least the semiconductor portion of the circuit, arranged in the common housing of claim 1, the connective portion having a top surface which includes ridges therein.

7. At least the semiconductor portion of the circuit, arranged in the common housing of claim 1, wherein the semiconductor switches and said control IC are arranged in a planar fashion.

8. At least the semiconductor portion of the circuit arranged in the common housing of claim 1, wherein the circuit further comprises at least one passive device.

9. At least the semiconductor portion of the circuit, arranged in the common housing of claim 8, wherein the at least one passive device is selected from the group consisting of at least one resistor, at least one capacitor, and at least one inductor.

10. A semiconductor device including first and second MOSFET die and a control IC die for controlling said first and second MOSFETs all contained in a common package; said common package having a conductive mounting surface; said first MOSFET die having a source and a gate electrode on one surface and a drain electrode on its opposite surface; said second MOSFET die having a drain electrode and a gate electrode on one surface and a source electrode on its opposite surface; said first and second die being conductively fixed to said conductive mounting surface at their source and gate and drain and gate electrodes, respectively, and being laterally spaced from one another.

11. The device of claim 10, wherein said IC die is a flip chip IC having one of its surfaces conductively fixed to said conductive mounting surface.

12. The device of claim 10, wherein said common package further includes a packaging structure, the packaging structure comprising a connective portion and a web portion, the connective portion connecting said first and second MOSFET die to each other.

13. The device of claim 12, wherein a top surface of said connective portion includes ridges therein.

14. The device of claim 12, wherein said common package further includes a resin or other nonconductive material encapsulating said packaging structure.

15. The device of claim 10, wherein said first and second MOSFET die and said control IC die are arranged in a planar fashion.

16. The device of claim 10, further including at least one passive device contained in said common package.

17. The device of claim 16, wherein said at least one passive device is selected from the group consisting of at least one resistor, at least one capacitor, and at least one inductor.

* * * * *